United States Patent
Figura et al.

(10) Patent No.: US 9,377,616 B1
(45) Date of Patent: Jun. 28, 2016

(54) METHOD OF MANUFACTURING A SUPPORT PLATE

(71) Applicant: Amazon Technologies, Inc., Seattle, WA (US)

(72) Inventors: Daniel Figura, Bratislava (SK); Geert Martens, Heerweg (NL); Romaric Mathieu Massard, Eindhoven (NL); Bokke Johannes Feenstra, Nuenen (NL)

(73) Assignee: Amazon Technologies, Inc., Seattle, WA (US)

( * ) Notice: Subject to any disclaimer, the term of this patent is extended or adjusted under 35 U.S.C. 154(b) by 98 days.

(21) Appl. No.: 14/134,550

(22) Filed: Dec. 19, 2013

(51) Int. Cl.
| G02B 26/00 | (2006.01) |
| G03F 7/00 | (2006.01) |
| H01L 21/28 | (2006.01) |
| H01L 21/31 | (2006.01) |

(52) U.S. Cl.
CPC ............ *G02B 26/005* (2013.01); *G03F 7/0005* (2013.01); *H01L 21/28* (2013.01); *H01L 21/31* (2013.01)

(58) Field of Classification Search
None
See application file for complete search history.

(56) References Cited

U.S. PATENT DOCUMENTS

| 6,153,075 A * | 11/2000 | Nemelka ................ C25D 13/00 204/485 |
| 8,896,903 B2 * | 11/2014 | Vermeulen ............. G09G 3/348 359/228 |
| 2002/0197492 A1* | 12/2002 | Hao ....................... C25D 5/022 428/457 |
| 2013/0010348 A1* | 1/2013 | Massard .............. G02B 26/005 359/290 |
| 2013/0271816 A1* | 10/2013 | Shim ................... G02B 26/005 359/290 |
| 2013/0321894 A1* | 12/2013 | Park ..................... G02B 26/005 359/290 |
| 2013/0329274 A1* | 12/2013 | Yang .................... G02B 26/005 359/290 |
| 2015/0277101 A1* | 10/2015 | Novoselov ............. H01L 21/28 359/290 |

FOREIGN PATENT DOCUMENTS

| WO | 2005098797 A2 | 10/2005 |
| WO | 2009065909 A1 | 5/2009 |
| WO | 2011058019 A1 | 5/2011 |

OTHER PUBLICATIONS

Chapter 18 of "Mobile Displays: Technology and Applications"; John Wiley & Sons, Ltd 2008.

* cited by examiner

*Primary Examiner* — Anita Alanko
(74) *Attorney, Agent, or Firm* — EIP US LLP (57) ABSTRACT

A method of manufacturing a support plate including: providing a layer of a first material; providing, using an applied voltage, a layer of a second material on a surface of the layer of the first material; and exposing a part of the surface by removing a part of the layer of the second material.

24 Claims, 5 Drawing Sheets

METHOD OF MANUFACTURING A SUPPORT PLATE

BACKGROUND

Known electrowetting display devices include two support plates. In examples, a pattern of walls is arranged on one of the support plates, the pattern defining the picture elements of the display device. The area between the walls of a picture element, also known as a pixel, is called the display area, over which a display effect occurs. The walls of the picture elements may be made of a hydrophilic material. The area of the support plate in the display area may to a large extent be hydrophobic for a proper operation of the picture element. During manufacture the area of the support plate where the picture elements are located is covered by a hydrophobic layer. The walls are made on this layer by depositing a layer of wall material on the hydrophobic layer and patterning the layer of wall material using for example a photolithographic method.

To improve adhesion between the layer of wall material and the hydrophobic layer, it is known to lower the hydrophobicity of the hydrophobic layer prior to applying the layer of wall material. After the formation of the walls, the area of the hydrophobic layer between the walls is annealed to regain its hydrophobicity. However, the quality of display devices made using this method is not satisfactory.

It is desirable to provide an improved method for manufacturing an electrowetting display device.

DETAILED DESCRIPTION

Figure 1:
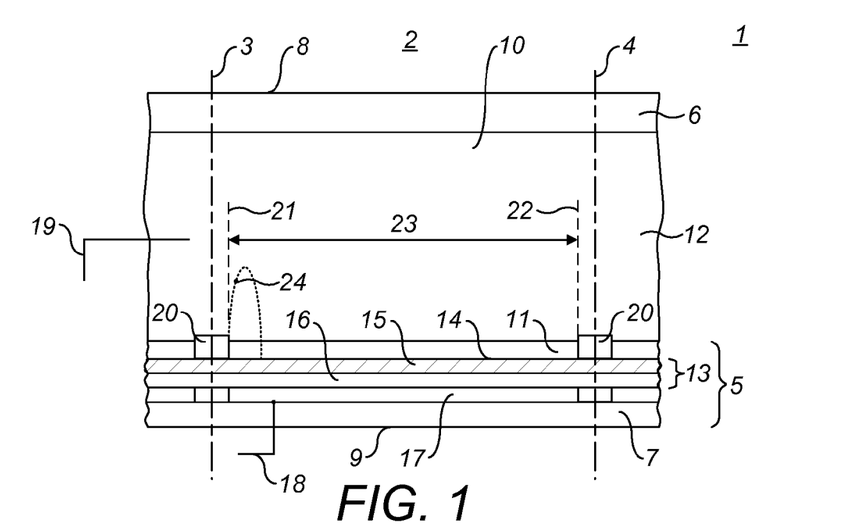
FIG. 1 shows schematically a cross section of a picture element of an electrowetting display device.

FIG. 1 shows a diagrammatic cross-section of part of an electrowetting device in the form of an electrowetting display device 1. The display device includes a plurality of picture elements 2, one of which is shown in the Figure. The lateral extent of the picture element is indicated in the Figure by two dashed lines 3, 4. The picture elements comprise a first support plate 5 and a second support plate 6. The support plates may be separate parts of each picture element, but the support plates may be shared in common by the plurality of picture elements. The support plates may include a glass or polymer substrate 6, 7 and may be rigid or flexible.

The display device has a viewing side 8 on which an image or display formed by the display device can be viewed and a rear side 9. In the Figure the first support plate 5 faces the rear side 9; the second support plate 6 faces the viewing side; alternatively, the first support plate may face the viewing side. The display device may be of the reflective, transmissive, transflective or transparent type. The display device may be of a segmented display type in which the image may be built up of segments, each segment including several picture elements. The display device may be an active matrix driven display type, a direct drive display type or a passively driven display device. The plurality of picture elements may be monochrome. For a color display device the picture elements may be divided in groups, each group having a different color; alternatively, an individual picture element may be able to show different colors.

A space 10 between the support plates is filled with two fluids: a first fluid 11 and a second fluid 12 at least one of which may be a liquid. The second fluid is immiscible with the first fluid. The second fluid is electrically conductive or polar and may be water or a salt solution such as a solution of potassium chloride in water. The second fluid may be transparent, but may be colored, white, absorbing or reflecting. The first fluid is electrically non-conductive and may for instance be an alkane like hexadecane or (silicone) oil.

The first fluid absorbs at least a part of the optical spectrum. The first fluid may be transmissive for a part of the optical spectrum, forming a color filter. For this purpose the first fluid may be colored by addition of pigment particles or a dye. Alternatively, the first fluid may be black, i.e. absorb substantially all parts of the optical spectrum, or reflecting. A reflective layer may reflect the entire visible spectrum, making the layer appear white, or part of it, making it have a color.

The support plate 5 includes an insulating layer 13. The insulating layer may be transparent or reflective. The insulating layer 13 may extend between walls of a picture element. However, to avoid short circuits between the second fluid 12 and electrodes arranged under the insulating layer, layers of the insulating layer may extend uninterrupted over a plurality of picture elements 2, as shown in the Figure. The insulating layer has a hydrophobic surface 14 facing the space 10 of the picture element 2. The thickness of the insulating layer may be less than 2 micrometer and may be less than 1 micrometer.

The insulating layer may be a hydrophobic layer; alternatively, it may include a hydrophobic layer 15 and a barrier layer 16 with predetermined dielectric properties, the hydrophobic layer 15 facing the space 10, as shown in the Figure. The barrier layer 16 may have a thickness, taken in a direction perpendicular the plane of the substrate, of for example between 100 nanometers and 150 nanometers and may be made of an inorganic material like silicon oxide or silicon nitride or a stack of these (for example, silicon oxide—silicon nitride—silicon oxide) or an organic material like polyimide or parylene. The barrier layer may comprise multiple layers having different dielectric constants. The hydrophobic layer may be formed of an amorphous fluoropolymer layer such as AF1600 or AF1601 (available from DuPont, 1007 Market St., Wilmington, Del., USA), Hyflon AD® (available from Solvay, Solvay SA, rue de Ransbeek, 310-B-1120 Brussels, Belgium), Cytop (available from AGC Chemicals Europe, Ltd, PO Box 4, York House, Hillhouse International, Thornton Cleveleys, Lancashire FY5 4QD, United Kingdom) or any other low surface energy polymer.

The hydrophobic character of the surface 14 causes the first fluid 11 to adhere preferentially to the insulating layer 13, since the first fluid has a higher wettability with respect to the surface of the insulating layer 13 than the second fluid 12. Wettability relates to the relative affinity of a fluid for the surface of a solid. Wettability may be measured by the contact angle between the fluid and the surface of the solid. The contact angle is determined by the difference between surface tension of the fluid and the surface energy of the solid at the fluid-solid boundary. For example, a high difference in surface tension and surface energy can indicate hydrophobic properties.

Each element 2 includes an electrode 17 as part of the support plate 5. The electrode 17 is separated from the fluids by the insulating layer 13; electrodes of neighboring picture elements are separated by a non-conducting layer. In some examples, further layers may be arranged between the insulating layer 13 and the electrode 17. The electrode 17 can be of any desired shape or form. The electrode 17 of a picture element is supplied with voltage signals by a signal line 18, schematically indicated in the Figure. A second signal line 19 is connected to an electrode that is in contact with the conductive second fluid 12. This electrode may be common to all elements, for example when they are fluidly interconnected by and share the second fluid, uninterrupted by walls, when the walls extend partly from the first support plate to the second support plate. In the example below that the walls extend from the first support plate to the second support plate the electrode connected to the second signal line 19 may also be common to all elements. The picture element 2 can be controlled by a voltage V applied between the signal lines 18 and 19. The electrodes 17 on the substrate 7 are coupled to a display driving system. In a display device having the picture elements arranged in a matrix form, the electrodes can be coupled to a matrix of control lines on the substrate 7.

The first fluid 11 is confined to one picture element by walls 20 that follow the cross-section of the picture element. The cross-section of a picture element may have any shape; when the picture elements are arranged in a matrix form, the cross-section is usually square or rectangular. Although the walls are shown as structures protruding from the insulating layer 13, they may instead be a surface layer of the support plate that repels the first fluid, such as a hydrophilic or less hydrophobic layer. The walls may extend from the first to the second support plate but may also extend partly from the first support plate to the second support plate as shown in FIG. 1. The extent of the picture element, indicated by the dashed lines 3 and 4, is defined by the center of the walls 20. The area between the walls of a picture element, indicated by the dashed lines 21 and 22, is called the display area 23, otherwise referred to herein as a second area, over which a display effect occurs.

Figure 2:
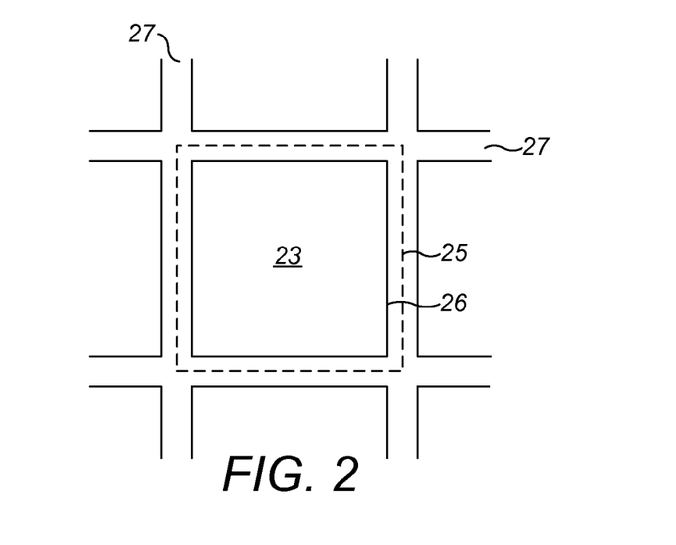
FIG. 2 shows schematically a plan view of a support plate of the display device.

FIG. 2 shows a matrix of square picture elements in a plan view of the hydrophobic layer of the first support plate. The extent of the central picture element in FIG. 2, corresponding to the dashed lines 3 and 4 in FIG. 1, is indicated by the dashed line 25. Line 26 indicates the inner border of at least one wall; the line is also the edge of the display area 23. A pattern of the at least one wall 20 covers a wall area 27, otherwise referred to herein as a first area.

When no voltage is applied between the electrodes, the first fluid 11 forms a layer between the walls 20, as shown in the FIG. 1. Application of a voltage will contract the first fluid, for example against a wall as shown by the dashed shape 24 in FIG. 1. The controllable shape of the first fluid is used to operate the picture element as a light valve, providing a display effect over the display area 23.

During the manufacturing process of the display device, the first support plate may be manufactured entirely, or may be provided during the manufacturing process as a partly or completely assembled support plate. When manufacturing the first support plate the substrate 7 is provided. An electrode layer comprising at least one electrode 17 is provided on the substrate 7. Subsequently, the insulating layer 13 in this example including the barrier layer 16 and the hydrophobic layer 15 is arranged on the electrode structure. Firstly, the barrier layer may be provided using Chemical Vapor Deposition (CVD) or Physical Vapor Deposition (PVD) for example sputter deposition or electron beam evaporation where temperature, pressure and power are controlled appropriately, as would be understood by the skilled person. The hydrophobic layer 15 may then be provided on the barrier layer, or in other examples on the electrode layer, for example by a wet coating process such as slit coating, flexoprinting, spin coating or dip coating as is well known in the art. The hydrophobic layer in the examples given here is a continuous uninterrupted layer common to all picture elements.

Subsequent steps of an example of manufacturing at least part of the support plate, for example for an electrowetting device, will now be described with reference to FIGS. 3 and 4A to 4C. In FIGS. 4A to 4C the insulating layer 13 is illustrated for clarity as a single layer, but as explained above may comprise a barrier layer and a hydrophobic layer or in other examples only a hydrophobic layer.

In the following description the material of the hydrophobic layer is referred to as the first material and the material for forming the walls is referred to as the second material.

Figure 3:
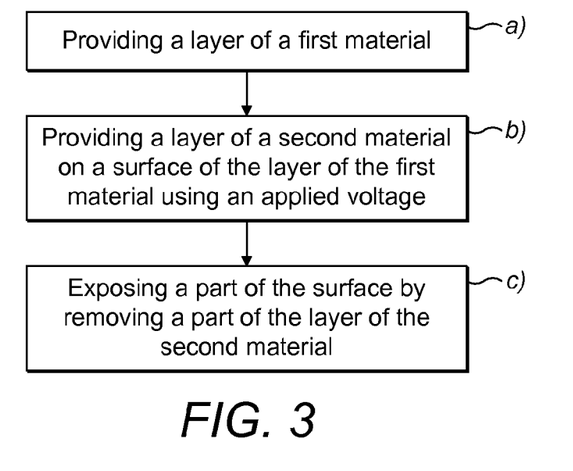
FIG. 3 is a flow diagram showing a method according to examples.
Figure 4A:
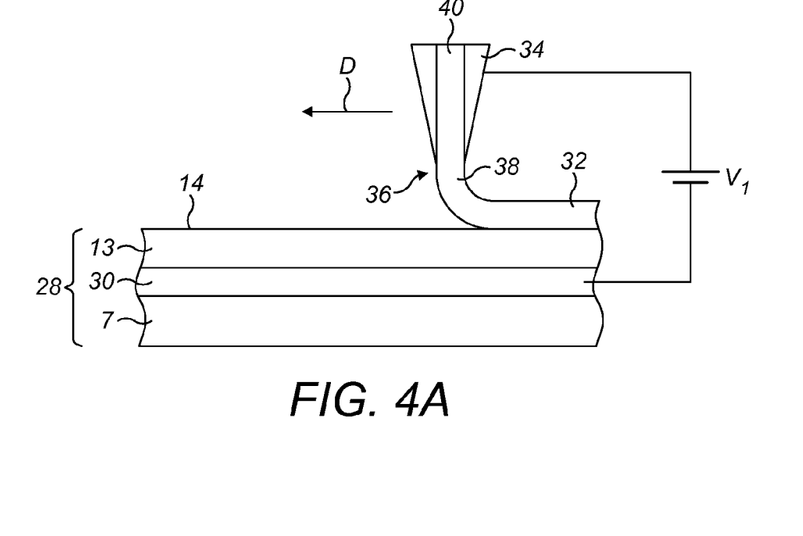
FIGS. 4A to 4C show schematically a method of manufacturing a support plate according to an example.
Figure 4B:
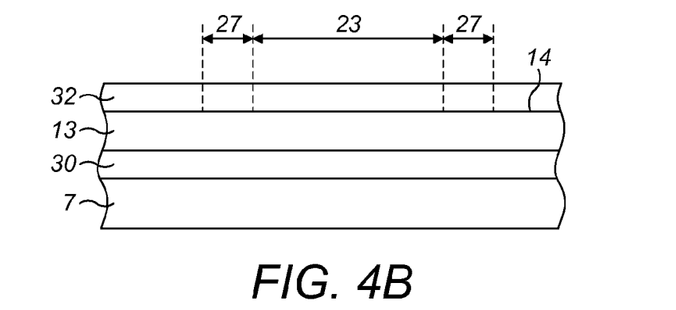
Figure 4C:
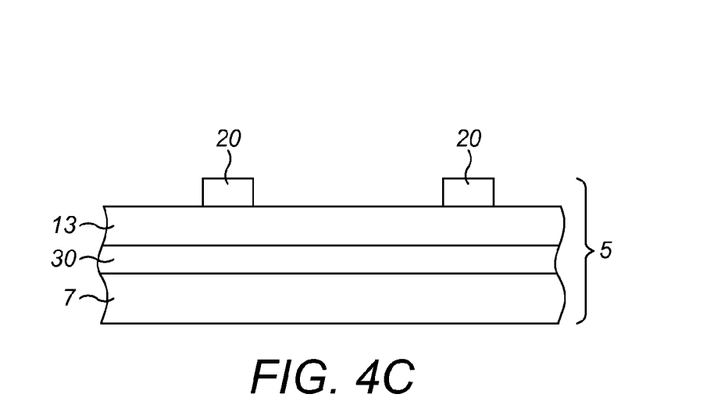

FIG. 3 shows an overview of steps of a method of manufacturing at least part of a support plate for an electrowetting device for example. Examples to be described relate to the electrowetting display device described previously.

Referring to FIG. 3, the method of examples includes:
a) providing a layer of a first material;
b) providing, using an applied voltage, a layer of a second material on a surface of the layer of the first material; and
c) exposing a part of the surface by removing a part of the layer of the second material.

Further details will now be described with reference to the example described using FIGS. 4A to 4C.

The layer of the first material is in this example provided as part of a partly assembled support plate 28, for example the substrate 7 with the electrode layer 30 and the insulating layer 13 applied thereon. For clarity, the electrode layer 30 is illustrated in FIGS. 4A to 4C without showing the non-conducting layers separating the electrodes of neighboring picture elements.

Referring to FIG. 4A, a layer of a second material 32 is provided on the surface 14 of the insulating, hydrophobic layer. The second material is provided on the surface in this example by a dispenser 34. The dispenser in this example has an elongated opening 36 along an axis perpendicular to the plane of the Figure. In another example the second material may be dispensed by an inkjet head. In the present example, the second material is dispensed 38 as a liquid from the dispenser, via a conduit 40 and through the opening, onto the surface. At the same time the dispenser and the surface are moved relatively to each other, i.e. one or both of the dispenser and the surface may be moved relative to the other of the dispenser and the surface. For example the dispenser may be moved in a direction D over the surface. In this way, the layer 32 of the second material is provided on the surface. This technique may be referred to as "slit coating"; the surface is coated by an elongate flow of the liquid second material resembling a curtain. The thickness and uniformity of the layer may be controlled by tuning dispensing parameters like the flow speed of the liquid second material, the speed of moving the dispenser, the slit height, i.e. the height of the elongated opening, from the surface, as well as by second material parameters like viscosity and solid content. These will be explained further below with reference to FIG. 5.

The liquid second material is for example a liquid photoresist such as liquid SU8 3005, KMPR 1005 (available from MicroChem Corp., 90 Oak St. Newton, Mass. 02464), AZ 125nXT (available from AZ Electronic Materials Hong Kong Limited, Unit 601-2, Li Po Chun Chambers, 189 Des Voeux Road Central, Sheung Wan, Hong Kong) or ma-N 490 (available from micro resist technology GmbH Koepenicker Str. 325 12555 Berlin GERMANY). The liquid second material may be polar and/or electrically conductive. For example, a solvent in liquid SU8 may be an organic solvent, for example cyclopentanone or propylene glycol monomethyl ether acetate (PGMEA).

The principles of electrowetting may be used to assist providing a layer of the second material on the surface, by using an applied voltage $V_1$. For example, a voltage may be applied between the second material and the at least one electrode of the electrode layer 30. As explained above, the at least one electrode is located at an opposite side of the layer of the first material, i.e. the insulating, hydrophobic layer, from the surface 14. In other words at least the layer of the first material separates the at least one electrode and the second material. The voltage may be applied for example by applying the voltage $V_1$ between the dispenser, for example by applying a potential to a metallic wall of the conduit with which the liquid second material is in contact, and the at least one electrode.

By applying the voltage $V_1$, the surface 14 local to the dispenser becomes charged which increases a tendency for the liquid second material to wet the surface, in view of the polar and/or electrically conductive properties of the liquid second material. In other words, the applied voltage increases the wettability of the liquid second material on the surface.

It has been found that using an applied voltage to assist providing the layer of the second material on the surface allows a continuous layer of liquid second material to be applied to the surface, of a suitably even thickness. Without using an applied voltage, the liquid second material would instead tend to be repelled by the surface, particularly in examples where the surface is hydrophobic, resulting in: nucleation and therefore droplets of the liquid second material on the surface, local dewetting of the liquid second material, and/or an increased sensitivity to particles, contaminants or non-uniformities on the surface. The magnitude of the applied voltage may equal or exceed a voltage threshold at which the second liquid material has an increased wettability on the surface, compared with a wettability of the second material on the surface when a magnitude of the applied voltage is set below the voltage threshold. At a voltage magnitude below the threshold the second liquid material may tend to dewet the surface. Moreover, the attraction of the liquid second material to the surface, caused by the applied voltage, causes the molecules of the second material to interact and fit more closely with a molecular topography of the surface. As a result, a closer join between the second material and the surface is obtained, meaning a better adhesion of the second material to the surface of the first material, despite the first material being hydrophobic in some examples.

The liquid second material solidifies after having been dispensed on the surface. This solidification may be caused by at least partial evaporation of the solvent, causing the liquid second material to dry. This drying may be air drying or performed in a controlled and inert gaseous atmosphere. Heating and/or a flow of a gas over the liquid second material may assist the drying.

The liquid second material may be formulated, for example by appropriate selection of a solvent, to dry sufficiently quickly such that the second material is substantially solid when the dispenser has dispensed the second material at a location on the surface and the applied voltage is no longer applied at the location, due to the dispenser moving further along the surface. Where the voltage is no longer applied at the location, there may still be a weak applied voltage, but not sufficiently strong to enable increased wetting of the surface by the liquid second material. By substantially solid it is meant that the second material may not be entirely solid, but is sufficiently solid so as to maintain the dispensed layer shape when there is no applied voltage or the applied voltage would be too weak to prevent nucleation of the liquid second material on the surface.

FIG. 4B shows schematically the provided layer 32 of the second material on the surface 14. Next, a part of the surface is exposed by removing a part of the layer of the second material. In this example, the part of the surface to be exposed is to form a display area 23 of a picture element; this is done by removing part of the second material and leaving on the surface a different part of the second material, indicated by the dashed lines in the Figure, to form the walls of the picture element on the wall area 27. In some examples, multiple parts of the second material may be removed, to form a plurality of picture elements of an electrowetting display device.

The second material is for example a photoresist material such as SU8. Therefore, to remove part of the second material and leave another part remaining, to form the display area and the walls of a picture element, respectively, the dispensed and substantially solidified layer of second material may for example be pre-baked, patterned using photolithography and part of the second material then removed using a suitable developer such as a solvent PGMEA, tetramethylammonium hydroxide (TMAH) or an alkaline developer. These steps are known to the skilled person. The resulting support plate 5 is illustrated in FIG. 4C and corresponds with the support plate 5 illustrated in FIG. 1.

It is noted that using an applied voltage to assist coating of a surface is known; however this technique is intended to permanently coat a surface. In other words, it is not intended to remove at least part of the coating after it has been applied. To achieve the permanency, as high a voltage as practically possible is used. This however causes such a close bond between the coating material and the surface material that the molecular texture of the surface is changed and/or permanent charges are included in or close to the surface, both of which permanently change the properties of the surface, for example wettability properties.

It has now been realized that an applied voltage may be used to provide the second material onto a surface, for example a hydrophobic surface, as described in examples previously, whilst enabling part of the surface to be exposed by removing part of the applied second material. The exposed part of the surface may have the same wettability as the surface of the first material before the application of the second layer thereon. Thus, the method of examples described herein provides reversible coating of a surface such as a hydrophobic surface. Despite this, there is sufficient adhesion between unremoved parts of the second material and the surface. In the example of an electrowetting display device, this gives sufficient adhesion of picture element walls to the hydrophobic surface.

In examples, a wettability of the surface 14, for example to the first fluid, is substantially unchanged after the layer of the second material has been provided thereon, compared with the wettability before providing the layer of second material thereon. For example, where the first material is a hydrophobic material, the hydrophobicity of the surface is substantially unchanged after the layer of the second material has been provided thereon, compared with the hydrophobicity before providing the layer of second material thereon. More specifically, the hydrophobicity may be substantially unchanged when the voltage is no longer applied, compared with the hydrophobicity before the voltage was applied. This may be achieved by for example setting a magnitude of the applied voltage below a voltage threshold at which the hydrophobicity of the surface changes permanently, i.e. not temporarily, i.e. irreversibly, due to for example a change in the chemical and/or physical structure of the first layer material and/or the permanent incorporation of charges on or close to the surface. The voltage magnitude may therefore be high enough to form sufficient adhesion between the second material and the surface but low enough such that the wettability and/or hydrophobicity is unchanged when the voltage is removed. Substantially unchanged means that the wettability and/or hydrophobicity after providing the second material on the surface using the voltage does not cause a deterioration in performance in the resulting electrowetting device. Thus the wettability of the surface of the display area and the wettability of the wall area is substantially the same. It is noted that during providing the second liquid material on the surface the wettability of the surface, for example its hydrophobicity, is changed temporarily due to the applied voltage. The applied voltage increases the wettability of the surface for the second material, i.e. renders the surface less hydrophobic. This change is not a chemical or physical change of the first material, but instead is caused by accumulation of reversible charge on the surface. Thus, temporary charging of the surface changes the wettability of the surface when the voltage is applied; when the voltage is no longer applied the charges are removed and the wettability reverts to that of the first material before the voltage was applied; hence this is a fully reversible and temporary change of wettability of the surface caused by the applied voltage.

Moreover, the magnitude of the voltage is set so that the second material provided on the surface may be removed without reducing the wettability, for example the hydrophobicity. In other words, the wettability such as the hydrophobicity may be substantially unchanged when the part of the layer of the second material is removed using for example a solvent. Substantially unchanged takes the same meaning as described above, but in relation to after removing the part of the second material compared with before removing the part of the second material. In this way, by maintaining the pristine wettability property of the surface after the second material has been provided, compared with before providing the second material, a high quality display device with effective fluid switching may be provided.

Figure 5:
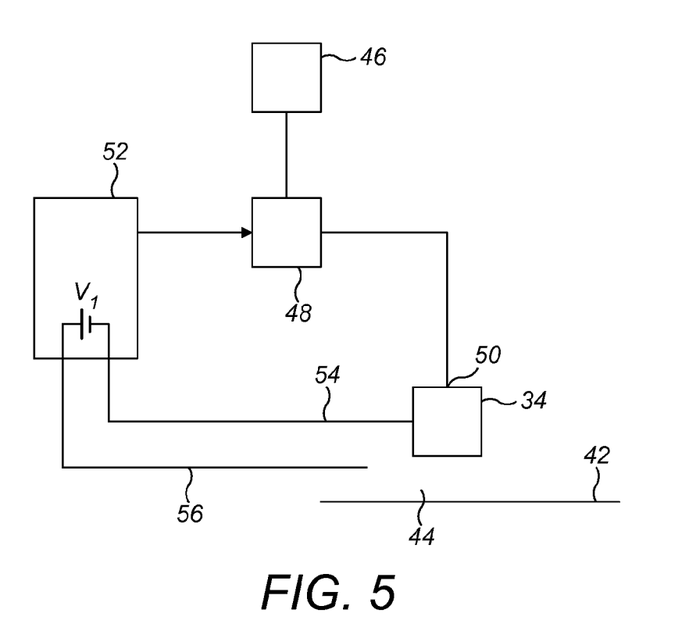
FIG. 5 shows schematically an example of apparatus for providing the method of an example.

The magnitude of the voltage set in specific examples depends on the chemical composition of the first and second materials, the interfacial and surface tensions and the thickness of the insulating layer 13. For example the voltage may be up to 50 Volts (V) but in other examples may be in the range of 10-50V, 10-40V, 10-30V or 10-20V. FIG. 5 shows an apparatus for providing a layer of the second material on the surface according to an example. The part assembled support plate can be arranged on a stage 42. The dispenser 34 described previously forms a gap 44 with the surface. The stage is mounted on a translation stage, for example (not shown), that enables the dispenser to move relative to the stage 42. A first container 46 for the liquid second material is connected to a first control unit 48, e.g. a valve or a pump that controls the amount of the liquid second material to be delivered to the dispenser 34 via a connection 50. A controller 52 provides signals for setting the first control unit to the desired settings. The apparatus may include a measurement device for determining the thickness of the dispensed layer. The thickness value may be used as input for setting the control unit. The apparatus may also include a device for measuring the shape and/or the size of the globule of liquid second material or the volume of liquid second material between the dispenser and the surface, e.g. using a camera observing the applicator in the direction of its long axis, using this input for setting the control unit. The height of the dispenser above the surface may be kept at a desired value, for example by measuring the height at the two far ends of the elongate dispenser and maintaining these at equal values. The controller may also use manual input from an operator of the apparatus instead of measured values. Further, the controller may control a speed that the dispenser moves relative to the surface, to control the dispensing of the layer of second material. Further, the controller 52 may control a magnitude of an applied voltage $V_1$ for assisting dispensing of the second material. For example, the controller may be electrically connected 54 to the dispenser 34 and have an electrical connection 56 for connecting to the at least one electrode of the partly assembled support plate.

The dispensing of the layer of the second material may be further tuned by controlling dispensing parameters such as a viscosity of the liquid second material, a drying time of the liquid second material for example by appropriate selection of solvent in the second material formulation and a concentration of solvent, a speed of moving the dispenser relative to the surface, a distance between the dispenser opening and the surface, the size of the dispenser opening and a flow rate of the liquid second material determined by the first control unit 48.

After completion of the manufacture of the first support plate 5, the first fluid 11 is applied using a known method, as disclosed for example in International patent publication no. WO2005/098797. The first support plate 5 and second support plate 6 are mounted together using e.g. pressure-sensitive adhesive, after the space 10 has been filled with the second liquid 12 in known manner, as disclosed for example in International patent publication no. WO2009/065909.

To detect if the method of examples described herein has been used, a join between a wall material and a surface of a hydrophobic layer of a picture element of an electrowetting display device may for example be examined in cross section under a microscope. When a molecular topography, i.e. a texture, of the surface adjoining the wall is the same, or sufficiently similar, as the molecular topography of the surface of the display area this indicates that the method of examples herein has been used. Moreover, analysis of the join should show a closer join between the second material and the surface compared with a join of the first and second materials when an applied voltage was not used.

The above examples are to be understood as illustrative. Further examples are envisaged. For example, where a matrix of picture elements is being manufactured, the at least one electrode in the electrode layer includes a plurality of electrodes. Each electrode, for example a first electrode and a second electrode, may be electrically connected to each other by an electrical connection, so that an electrical potential may be applied to the electrodes via one connection point, rather than having to apply a potential to each electrode individually. Then, once the second material has been provided on the surface, the electrical connections between the electrodes may be broken so that each picture element may be switched independently by controlling a potential applied to each electrode individually. A "scribe and break" technique or a "laser scribing" technique, both of which are well known to the skilled person, may be used to break the electrical connections, for example.

Figure 6A:
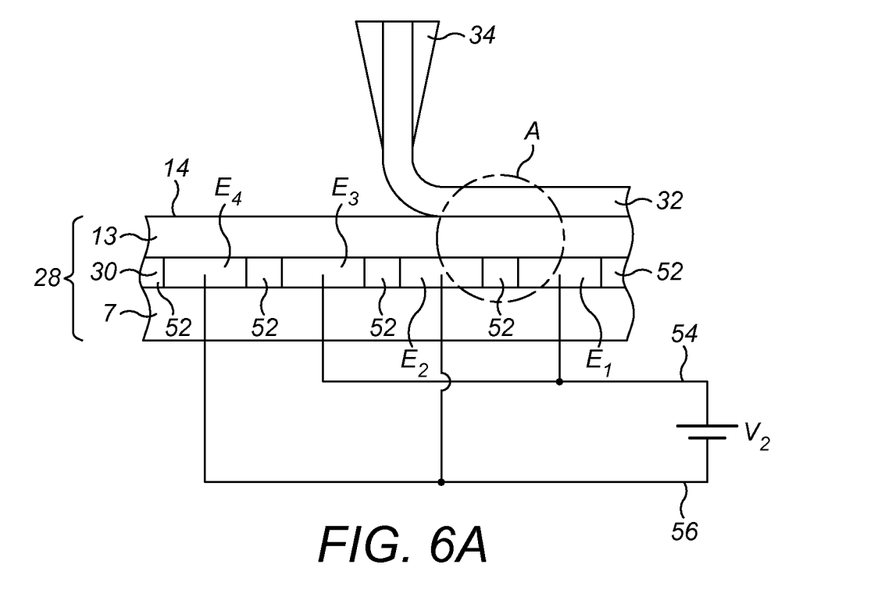
FIGS. 6A and 6B show schematically a step of a method of manufacturing a support plate according to a different example.
Figure 6B:
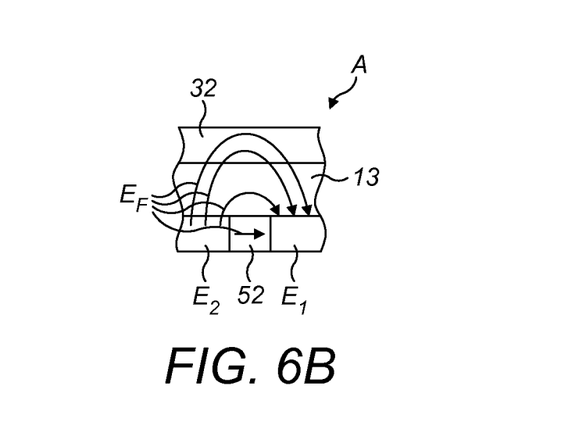

Another example is now described with reference to FIGS. 6A and 6B. Features here which are similar to those described previously are referred to using the same reference numerals. In this example, a dispenser similar to that described above is used to provide liquid second material on the surface. However, in this example a potential is not applied to the second material via the dispenser. Instead, a voltage $V_2$ is applied between a first electrode and at least one second electrode of the electrode layer, the first and second electrodes being adjacent each other. Example electrodes are labelled in the Figure as E1, E2, E3 and E4. The electrodes are electrically isolated from each other by non-conducting material 52 which will lie under walls when formed, or which in other examples may define parts of a display area without an underlying electrode for example a notch in an electrode. In this example a controller (not shown) may be electrically connected to apply a first potential to a first set of alternate electrodes including a first electrode E1 and a third electrode E3 and to apply a second potential to a second set of alternate electrodes including a second electrode E2 and a fourth electrode E4. Thus, the voltage $V_2$ may be applied between the first and second electrodes E1, E2. The applied voltage creates an electric field as shown in more detail in FIG. 6B which is an enlarged view of section A of FIG. 6A. The electric field lines are labelled EF. When the insulating layer and the liquid second material provided on the surface have a suitable permittivity, the electric field can propagate from the first electrode to the second electrode at least partly via the applied second material, thus increasing wetting of the surface by the liquid second material when dispensed. Thus, the applied voltage assists providing of the second material on the surface. As a result, the second material may be provided on and removed from the surface without substantially changing the wettability, such as a hydrophobicity, of the surface, whilst providing sufficient adhesion for the walls on the surface. Thus, in this and further envisaged examples, an electric field may be used to provide a layer of the second material on a layer of the first material.

In further examples, the magnitude of the applied voltage may be used to control a thickness of second material applied at a given location on the surface of the first material. For example, a higher voltage may cause greater attraction between the liquid second material and the surface, giving a thicker second material layer; a lower voltage may thus give a thinner second material layer. Controllably changing the voltage level as the second liquid material is dispensed over the surface may therefore give a second material layer with a changing thickness. Other settings such as the viscosity of the second liquid material, the speed of moving the dispenser, for example, may not therefore need to be changed to change the second material layer thickness. Further, if a plurality of electrodes are provided on an opposite side of the surface from the dispenser, a different voltage may be applied between the dispenser and two or more electrodes, thus causing the second material to be provided with a different thickness over the different underlying electrodes. This changing thickness can be used to aid a subsequent photolithographic process, for example with thinner second material present in a region to be removed during development or may be used to fine tune the thickness resulting from the process, while all other settings and conditions are kept the same. In some such examples, the liquid second material may be dispensed by ink-jetting; the nozzles of an ink jet head may be set at one electrical potential, with a plurality of underlying electrodes being set at different potentials, thus giving different voltage levels along the surface and giving a changing thickness of the second material when inkjetted.

In examples, the method described above may be used for manufacturing an electrowetting device including a layer of the first material having a surface and a layer of the second material adjoining a first area of the surface but not adjoining a second area of the surface, the second area adjoining at least one fluid. A wettability, for example to the first fluid, of the first area and of the second area of the surface are substantially the same. Substantially the same means for example that the contact angle of a fluid in contact with the first area is the same as when the fluid is in contact with the second area. In further examples, as described above, the method of examples may be used for manufacturing an electrowetting display device including at least one picture element defined by a pattern of at least one wall, the at least one wall being formed by a layer of the second material, the second area defining a display area of the at least one picture element.

It is to be understood that any feature described in relation to any one example may be used alone, or in combination with other features described and may also be used in combination with one or more features of any other of the examples, or any combination of any other of the examples. Furthermore, equivalents and modifications not described above may also be employed without departing from the scope of the accompanying claims.

What is claimed is:

1. A method of manufacturing a support plate, comprising:
 a) providing a layer of a first material having a surface;
 b) dispensing a second material from a dispenser;
 c) moving at least one of the dispenser or the surface in relation to the other of the at least one of the dispenser or the surface;
 d) applying an applied voltage between the second material and at least one electrode separated from the second material at least by the layer of the first material;
 e) providing a layer of the second material on the surface; and
 f) exposing a part of the surface by removing a part of the layer of the second material.

2. A method according to claim 1, wherein a wettability of the surface is substantially unchanged after the providing the layer of the second material on the surface, compared with the wettability of the surface before the providing the layer of the second material on the surface.

3. A method according to claim 1, wherein the surface is hydrophobic and a hydrophobicity of the surface is substantially unchanged after the providing the layer of the second material on the surface, compared with the hydrophobicity of the surface before the providing the layer of the second material on the surface.

4. A method according to claim 3, wherein a magnitude of the applied voltage is set below a voltage threshold at which the hydrophobicity of the surface changes irreversibly.

5. A method according to claim 3, wherein a magnitude of the applied voltage is set to equal or exceed a voltage threshold at which the second material, provided as a liquid, has increased wettability on the surface compared with a wettability of the second material on the surface with a magnitude of the applied voltage set below the voltage threshold.

6. A method according to claim 3, wherein the hydrophobicity of the surface is substantially unchanged after no longer applying the applied voltage, compared with the hydrophobicity of the surface before the applying the applied voltage.

7. A method according to claim 1, wherein a wettability of the surface is substantially unchanged by the removing the part of the layer of the second material.

8. A method according to claim 3, wherein the hydrophobicity of the surface is substantially unchanged by the removing the part of the layer of the second material.

9. A method according to claim 1, wherein the removing the part of the layer of the second material comprises one or more of: using a solvent to remove the part of the layer of the second material, or using a developer to remove the part of the layer of the second material.

10. A method according to claim 1, wherein the at least one electrode comprises a first electrode and a second electrode electrically connected to the first electrode by an electrical connection, the method comprising breaking the electrical connection after the providing the layer of the second material on the surface.

11. A method according to claim 1, the applying the applied voltage between the second material and the at least one electrode comprising applying a voltage between the dispenser and the at least one electrode, at least a portion of the second material in electrical contact with the dispenser.

12. A method according to claim 1, wherein the second material is a liquid which solidifies after the providing the layer of the second material on the surface.

13. A method according to claim 12, wherein the providing the layer of the second material on the surface comprises providing a portion of the second material at a location on the surface, the portion of the second material being substantially solid after the providing the portion of second material at the location and with the applied voltage no longer applied at the location.

14. A method according to claim 12, wherein the second material comprises one or more of: an organic solvent, cyclopenthanone solvent or propylene glycol monomethyl ether acetate (PGMEA).

15. A method according to claim 12, wherein the second material is electrically conductive or polar.

16. A method according to claim 1, wherein the at least one electrode is part of an electrode layer of the support plate being manufactured.

17. A method according to claim 1, comprising changing a magnitude of the applied voltage during the providing the layer of the second material on the surface, thereby providing the layer of the second material on the surface with a changing thickness.

18. A method according to claim 1, wherein the support plate is for an electrowetting device, the support plate being configured for positioning in the electrowetting device such that the part of the surface exposed by the removing the part of the layer of the second material is adjoined by at least one fluid of the electrowetting device.

19. A method according to claim 18, wherein the electrowetting device is an electrowetting display device comprising at least one picture element, wherein the second material is for forming at least one wall of the at least one picture element.

20. A method of manufacturing an electrowetting device, comprising:
    applying a voltage to a dispenser;
    dispensing a second material layer, using the voltage, from the dispenser onto a first surface of a first material layer of a first support plate, the first support plate further comprising an electrode;
    moving at least one of the dispenser or the first surface in relation to the other of the at least one of the dispenser or the first surface;
    exposing a first area of the first surface by removing a portion of the second material layer; and
    disposing a first fluid and a second fluid between the first support plate and a second support plate, the first fluid immiscible with the second fluid.

21. A method according to claim 20, wherein a magnitude of the voltage is set below a voltage threshold at which a hydrophobicity of the first surface changes irreversibly.

22. A method according to claim 20, further comprising: applying the voltage to the electrode.

23. A method of manufacturing a support plate, comprising:
    a) providing a layer of a first material having a surface;
    b) dispensing a second material from a dispenser;
    c) moving at least one of the dispenser or the surface in relation to the other of the at least one of the dispenser or the surface;
    d) applying an applied voltage between a first electrode and a second electrode each separated from the second material by at least the layer of the first material;
    e) providing a layer of the second material on the surface; and
    c) exposing a part of the surface by removing a part of the layer of the second material.

24. A method according to claim 23, wherein a wettability of the surface is substantially unchanged after the providing the layer of the second material on the surface, compared with the wettability of the surface before the providing the layer of the second material on the surface.

* * * * *